United States Patent
Cheng et al.

(10) Patent No.: US 7,223,669 B2
(45) Date of Patent: May 29, 2007

(54) STRUCTURE AND METHOD FOR COLLAR SELF-ALIGNED TO BURIED PLATE

(75) Inventors: Kangguo Cheng, Beacon, NY (US); Ramachandra Divakaruni, Ossining, NY (US); Carl J. Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 10/710,061

(22) Filed: Jun. 16, 2004

(65) Prior Publication Data

US 2005/0282393 A1    Dec. 22, 2005

(51) Int. Cl.
    *H01L 21/20*    (2006.01)
(52) U.S. Cl. .............. 438/386; 438/389; 438/391; 438/393; 438/394; 438/395
(58) Field of Classification Search .............. None
    See application file for complete search history.

(56) References Cited

U.S. PATENT DOCUMENTS

| | | | |
|---|---|---|---|
| 5,871,811 A | 2/1999 | Wang et al. | |
| 6,001,684 A | 12/1999 | Shen | |
| 6,057,216 A | 5/2000 | Economikos et al. | |
| 6,218,319 B1 | 4/2001 | Dutron et al. | |
| 6,271,141 B2 | 8/2001 | Juengling et al. | |
| 6,271,142 B1 | 8/2001 | Gruening et al. | |
| 6,316,310 B1 | 11/2001 | Wensley et al. | |
| 6,365,485 B1 | 4/2002 | Shiao et al. | |
| 6,541,334 B2 * | 4/2003 | Luetzen et al. | 438/243 |
| 6,544,856 B2 | 4/2003 | Morhard et al. | |
| 6,599,798 B2 * | 7/2003 | Tews et al. | 438/249 |
| 6,638,815 B1 * | 10/2003 | Bronner et al. | 438/246 |
| 6,979,613 B1 * | 12/2005 | Wu et al. | 438/243 |
| 2004/0048441 A1 * | 3/2004 | Akatsu et al. | 438/386 |

* cited by examiner

*Primary Examiner*—Duy-Vu N Deo
(74) *Attorney, Agent, or Firm*—Daryl K. Neff; Yuanmin Cai (57) ABSTRACT

A structure and method are provided for forming a collar surrounding a portion of a trench in a semiconductor substrate, the collar having a lower edge self-aligned to a top edge of a buried plate disposed adjacent to a lower portion of the trench.

15 Claims, 8 Drawing Sheets

STRUCTURE AND METHOD FOR COLLAR SELF-ALIGNED TO BURIED PLATE

BACKGROUND OF INVENTION

The invention relates to semiconductor processing, and more particularly to an improved method for forming a buried plate and a collar such as in the fabrication of a trench capacitor of an advanced microelectronic device, e.g., a dynamic random access memory (DRAM).

A goal of the semiconductor industry is to increase the circuit density of integrated circuits ("ICs" or "chips"), most often by decreasing the size of individual devices and circuit elements of a chip. Trench capacitors are used in some types of DRAMs for storing data bits. Often, increasing the circuit density of such DRAMs requires reducing the size of the trench capacitor, which, in turn, requires reducing the area of the chip occupied by the trench capacitor. Achieving such reduction in surface area is not straightforward, because different components of the storage capacitor do not scale at the same rate, and some components cannot be scaled below a certain size.

One problem of conventional fabrication techniques is that the buried plate of the trench capacitor is formed in a processing step which is separate from that in which a collar is formed above the buried plate. Because of this, the trench capacitor has lower than desired capacitance when a lower edge of the collar is disposed too deep, such that the collar covers up a part of the trench sidewall along which the buried plate is disposed. Conversely, when the lower edge of the collar is disposed at too high a location and does not contact the buried plate, undesirably high leakage current results.

Therefore, it would be desirable to provide a structure and method of forming a buried plate of a trench capacitor in which the lower edge of the collar is self-aligned to the buried plate.

SUMMARY OF INVENTION

According to an aspect of the invention, a method is provided for making a collar for a trench disposed in a semiconductor substrate, the collar being self-aligned to a buried plate disposed adjacent to the trench. In such method, a trench is formed in a semiconductor substrate. A dopant source layer is deposited in the trench. The dopant source layer is recessed to a first depth below a major surface of the semiconductor substrate. A barrier layer is formed along a portion of the sidewall of the trench above the first depth. Thereafter, the dopant source layer is further recessed to a second depth below the first depth to expose a middle portion of the sidewall of the trench, such that the dopant source layer remains below the second depth. Annealing is performed in an oxygen-containing environment to simultaneously form an oxide collar along the middle portion of the trench sidewall and form a buried plate in the semiconductor substrate adjacent to the dopant source layer.

According to another aspect of the invention, a method is provided for making a collar for a trench disposed in a semiconductor substrate, the collar being self-aligned to a buried plate disposed adjacent to the trench. According to such method, a trench is etched to a first depth below a major surface of a semiconductor substrate. A barrier layer is formed along a top portion of the sidewall of the trench above the first depth. Thereafter, the trench is etched to a bottom depth below the first depth. A dopant source layer is deposited in the trench. A top surface of the dopant source layer is recessed to a second depth below the first depth to expose a middle portion of the trench sidewall between the first and second depths, while the dopant source layer remains in the trench below the second depth. Annealing is performed in an oxygen-containing environment to simultaneously form an oxide collar by local oxidation of the semiconductor substrate along the middle portion of the trench sidewall and form a buried plate in the semiconductor substrate adjacent to the dopant source layer.

According to yet another aspect of the invention, a structure is provided in which a collar surrounds a middle portion of a trench in a semiconductor substrate, the collar having a lower edge self-aligned to a top edge of a buried plate disposed adjacent to a lower portion of the trench.

DETAILED DESCRIPTION

The embodiments of the invention described herein address problems of the conventional non-self-aligned process of making a trench capacitor through separate steps for forming the buried plate and the collar. In a first embodiment described below, a trench is etched into a semiconductor substrate, after which a layer of arsenic doped glass (ASG) or other suitable material is deposited into the trench as a dopant source material and recessed. A barrier layer is then formed along a top portion of the trench sidewall above the level of the recessed ASG layer. Thereafter, the ASG layer is further recessed to expose a middle portion of the trench sidewall, while the ASG layer remains in place along a lower portion of the trench sidewall below the middle portion. A cap layer covering the remaining ASG layer is then formed, after which etching is performed to clear the material of the cap layer from the middle portion of the trench sidewall. An anneal is then performed in an oxygen-containing environment to simultaneously form the buried plate in the semiconductor substrate adjacent to the lower portion of the trench sidewall and form an oxide collar along the middle portion of the trench sidewall.

In another embodiment of the invention, the trench is etched initially into the semiconductor substrate only to a first depth, which is less than the full depth of the trench when completed. A barrier layer is then formed along the sidewall of the trench that has been etched only to the first depth. Thereafter, the trench is etched to the full depth, after which a layer of arsenic doped glass (ASG) or other suitable material is deposited as a dopant source layer. The ASG layer is then recessed to expose a middle portion of the trench sidewall, while the ASG layer remains in place along a lower portion of the trench sidewall below the middle portion. As in the above-described embodiment, a cap layer covering the remaining ASG layer is then formed, after which etching is performed to clear the material of the cap layer from the middle portion of the trench sidewall. An anneal is then performed in an oxygen-containing environment to simultaneously form the buried plate in the semiconductor substrate along the lower portion of the trench sidewall and to form an oxide collar along the middle portion of the trench sidewall.

Figure 1:
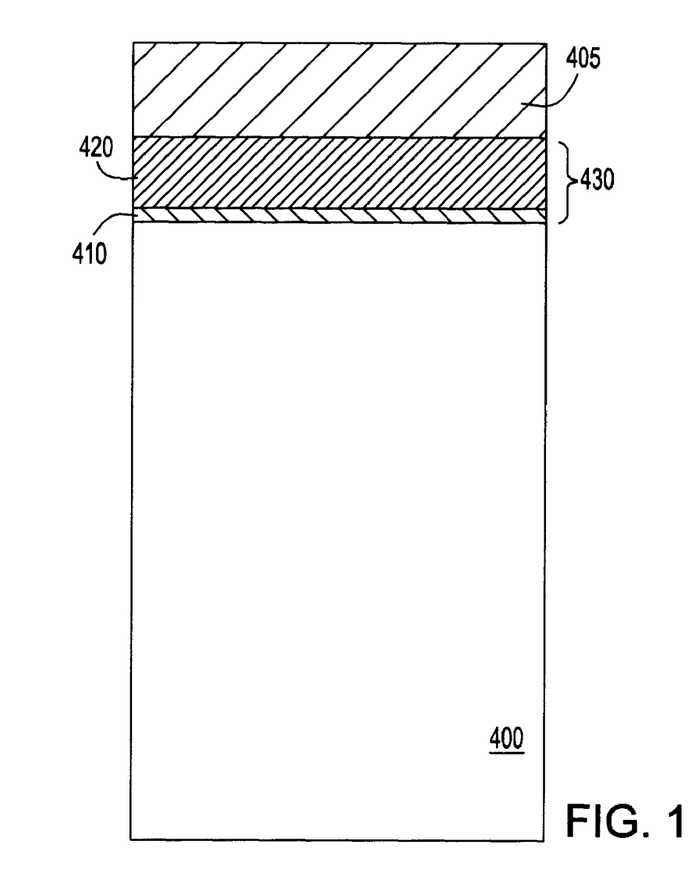
FIGS. 1 through 12 are cross-sectional views illustrating stages of processing according to a first embodiment of the invention.
Figure 2:
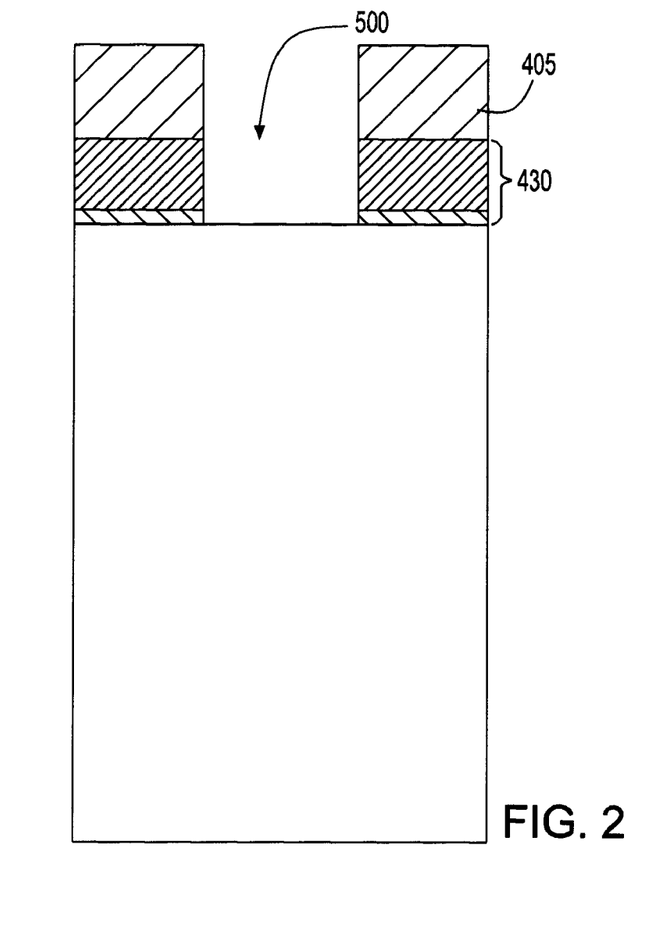
Figure 3:
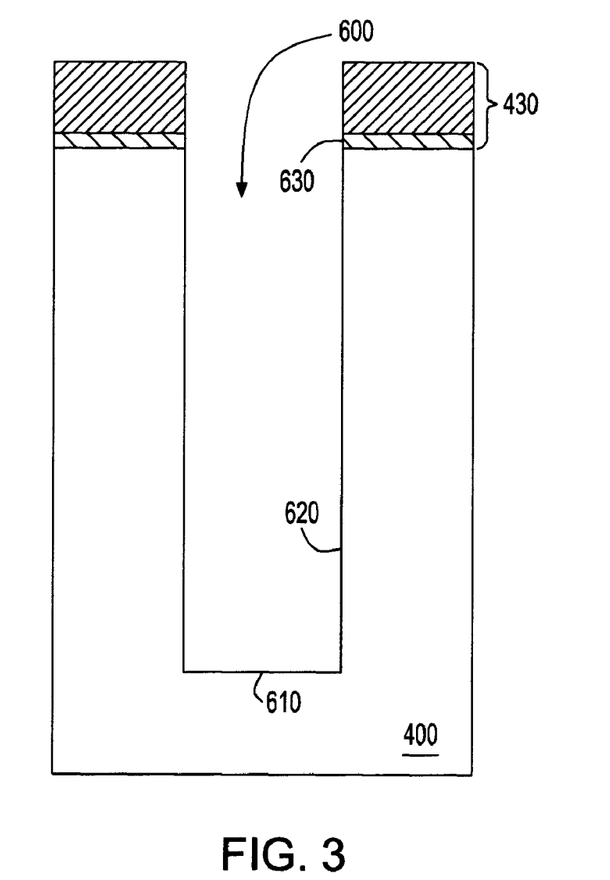

FIGS. 1 through 12 illustrate stages in processing according to the first embodiment of the invention. FIGS. 1 through 3 illustrate a process of patterning a trench. Illustratively, in this process, the trench is patterned in a semiconductor substrate 400, which typically consists essentially of p-type doped silicon. Alternatively, the substrate has a semiconductor-on-insulator type structure, e.g., is a silicon-on-insulator (SOI) substrate. Other suitable alternative types of substrates include germanium, silicon germanium, silicon carbide, strained silicon, and those consisting essentially of one or more III–V compound semiconductors having a composition defined by the formula $Al_{X1}Ga_{X2}In_{X3}As_{Y1}P_{Y2}N_{Y3}Sb_{Y4}$, where X1, X2 X3, Y1, Y2, Y3, and Y4 represent relative proportions, each greater than or equal to zero and X1+X2+X3+Y1+Y2+Y3+Y4=1 (1 being the total relative mole quantity). Other suitable substrates can be formed of II–VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

A variety of methods may be utilized to form the deep trench. Typically, a mask layer is first formed and patterned on the substrate, being comprised of a material less susceptible to etching, such as a hardmask layer of silicon oxide and/or silicon nitride or other material. FIG. 1 shows one embodiment in which an oxide layer 405 functions as a hardmask layer, disposed over a pad stack 430 having a nitride layer 420 and an optional oxide layer 410. The oxide layer 410 is formed between the pad nitride layer 420 and the semiconductor substrate 400 as a buffer layer to improve the adhesion of the pad nitride layer 420 and to reduce the interface stress.

As shown in the cross-sectional depiction of FIG. 2, the hardmask layer 405 is patterned and etched to create an opening 500 through which the trench will then be formed in the semiconductor substrate. Patterning can be done by forming a photoresist layer (not shown) and developed by any suitable process such as optical lithography, electron beam lithography, x-ray lithography, and ion beam lithography. The hardmask layer 405, along with the underlying pad stack 430 can then be etched selective to the photoresist using any conventional etch process, for example, reactive ion etch (RIE). The photoresist is stripped after forming opening the hardmask or after opening the hardmask and the underlying pad stack.

Figure 6:
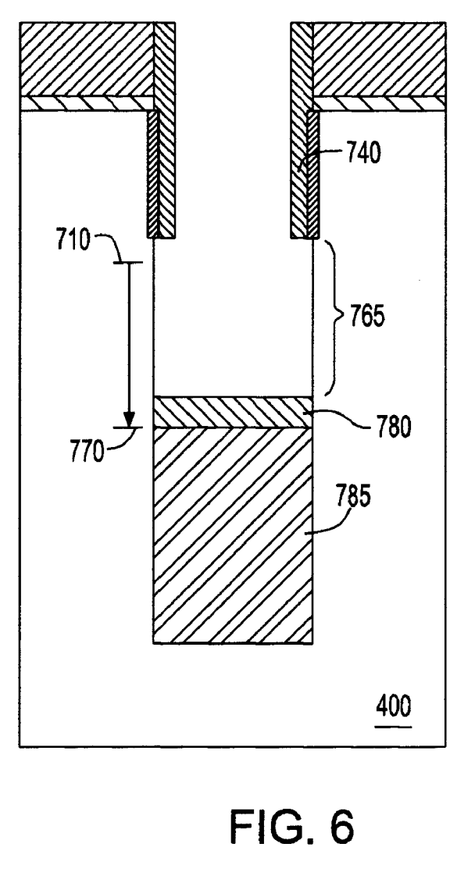

Referring to FIG. 3, the substrate 400 then is etched by any suitable process such as RIE to form deep trench 600. The remaining hardmask layer is stripped after forming the deep trench. The deep trench has a small width, typically ranging from 90 nm to 150 nm according to the current generation of semiconductor devices. The deep trench is etched to a depth ranging between about 2 microns (μm) and 10 μm. Etching defines a trench 600 having a sidewall 620 and a bottom 610. In one embodiment as illustrated in FIG. 6, the trench 600 is patterned in a manner that aligns an edge 630 of the pad stack 430 to the sidewall 620 of the trench 600. Hereinafter, references generally to the trench sidewall and to the lower portion of the trench sidewall shall be understood to include the trench bottom 610, as well.

Figure 4:
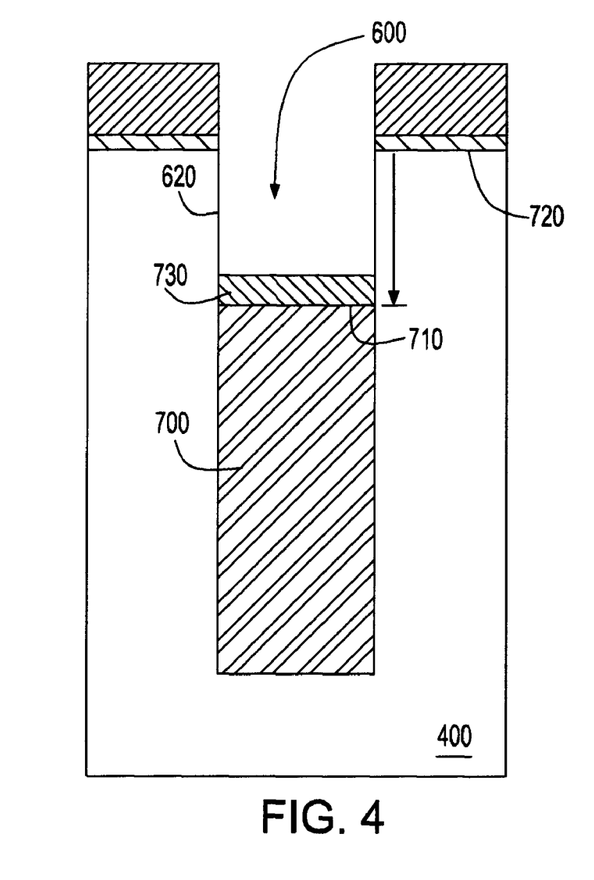

Referring to FIG. 4, a layer of arsenic doped glass (ASG) 700 or other suitable dopant source layer is deposited in the trench 600 and then recessed to a first depth 710 below the major surface 720 of the semiconductor substrate 400. The ASG layer 700 is illustratively performed by LPCVD, CVD (chemical vapor deposition), PECVD (plasma enhanced CVD), atomic layer deposition (ALD), or other suitable method. Preferably, low-pressure chemical vapor deposition (LPCVD) is used to deposit one or more relatively thin, high quality films to form ASG layer 700. In a preferred embodiment, the ASG deposition is conducted by LPCVD at 700° C. for about 60 minutes, resulting in the filling of the trench, after which the ASG layer is recessed to depth 710. Alternatively, the layer 700 includes a dopant source layer adjacent to the semiconductor substrate 400 and another material, which is preferably undoped, to fill the trench 600. The dopant source layer is preferably an ASG layer and the undoped material is preferably undoped oxide. In such case, hereinafter, the layer 700 is referred to as the "ASG layer 700" for simplicity.

Optionally, a cap layer 730 is preferably formed to cover the ASG layer 700 within the trench 600. The cap layer 730 preferably consists essentially of an undoped oxide such as silicon dioxide, and is preferably deposited by a process which deposits material preferentially onto horizontal surfaces, in preference over vertical surfaces such as the trench sidewall 620. Preferably, the cap layer is deposited by high density plasma (HDP) CVD process. The deposition rate of HDP process is higher in the vertical direction than in the lateral direction. Thereafter, etching is performed to remove deposited oxide from the trench sidewall 620, while preserving the cap layer 730 overlying the ASG layer 700. The oxide on the trench sidewall is preferably removed by a timed-etch with a buffered hydrofluoric (BHF) chemistry.

Figure 5:
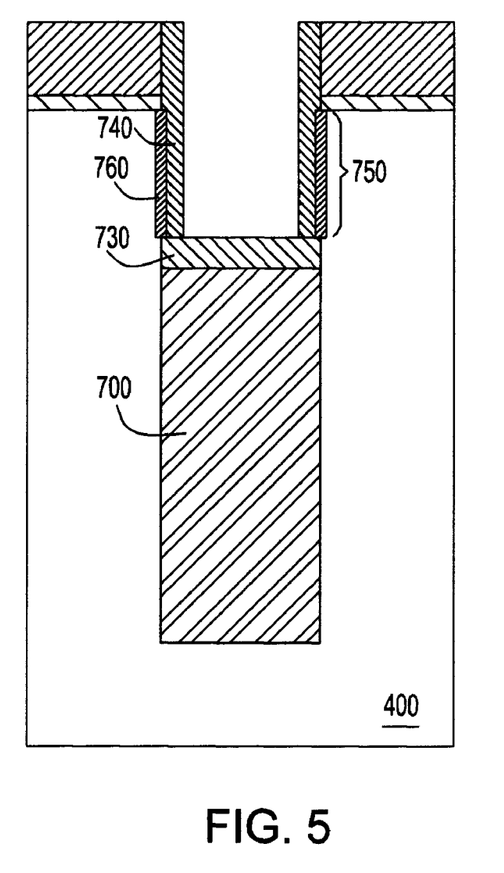

Thereafter, as shown in FIG. 5, processing is performed to form a barrier layer 740 along a top portion 750 of the sidewall of the trench, extending upwardly from the ASG layer 700 or optional cap 730 formed on the ASG layer 700. The barrier layer 740 preferably consists of a nitride such as silicon nitride, to facilitate etch selectivity during oxide etching to be performed later of the oxide cap layer 730 and later formed oxide collar. Such barrier layer is formed by low-pressure chemical vapor deposition (LPCVD), chemical vapor deposition (CVD), atomic layer deposition or other suitable method. Preferably, an oxide liner 760 is first formed on the top portion 750 of the trench sidewall, as by a brief thermal oxidation, after which silicon nitride is preferably deposited as the barrier layer by LPCVD at a temperature of approximately 700° C. Alternatively, the buried layer 740 may include a deposited or in situ formed silicide such as cobalt silicide, nickel silicide, tungsten silicide, and titanium silicide. Other alternatives include titanium nitride, tantalum nitride, silicon carbide, or any other suitable materials. A reactive ion etch is then performed to clear the deposited material of the barrier layer 740 from the top surface of the oxide cap layer 730.

Thereafter, the oxide cap layer 730 is removed and the ASG layer is further recessed by etching selective to the material of the barrier layer 740 to produce the structure as shown in FIG. 6. As shown therein, the top of the remaining ASG layer 785 is now recessed to a second depth 770, which is lower than the first depth 710. Optionally, a further cap layer 780 is now formed over the remaining ASG layer 785, the cap layer 780 preferably consisting essentially of a material such as silicon nitride, other nitride or other material which facilitates good etch selectivity relative to silicon dioxide. The cap layer 780 is formed in a manner similar to that described above for forming the oxide cap layer 730 (FIG. 5), except for the material (silicon nitride) of which the cap layer 780 is preferably formed. After forming the cap layer 780, the semiconductor substrate 400 along the middle portion 765 of the sidewall of the trench is exposed.

Figure 7:
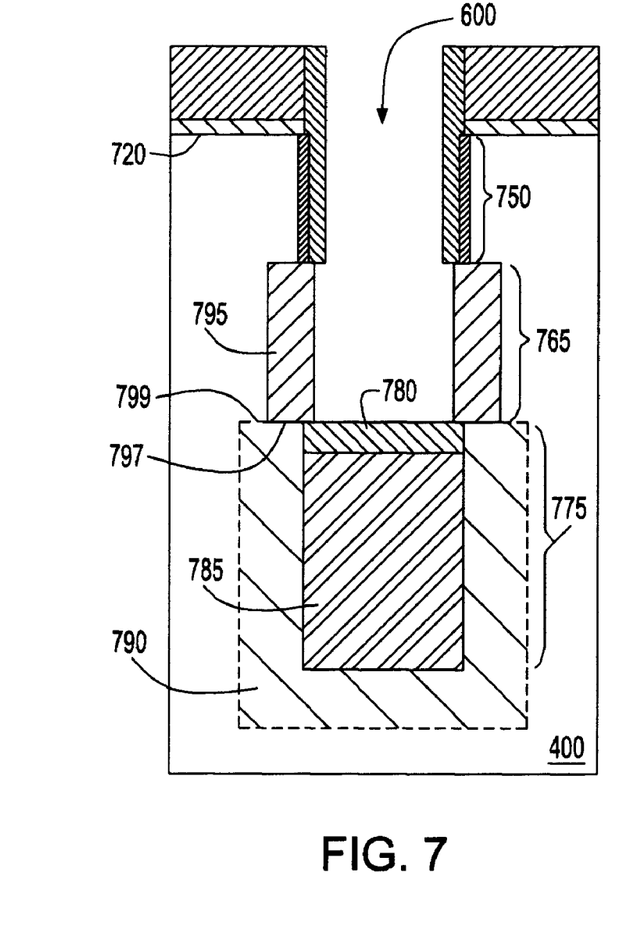

Thereafter, as shown in FIG. 7, annealing is performed in an oxygen-containing environment to drive the dopant in the ASG layer 785 into the substrate and thus form a buried plate 790 in the region of the substrate 400 adjacent to and preferably surrounding a bottom portion 775 of the trench 600. During this anneal, the region of the semiconductor substrate 400 along the middle portion 765 of the trench sidewall is also oxidized in the oxygen-containing environment to form an oxide collar 795. Annealing is preferably performed at a temperature between about 900° C. and 1150° C., and more preferably at about 1050° C. During this anneal, the cap layer 780 helps protect against arsenic doping of the semiconductor substrate 400 disposed along the middle portion 765 and top portion 750 of the trench sidewall, despite the proximity thereto of the ASG layer 785 in the trench 600. As a result of the simultaneous formation of the buried plate 790 and the oxide collar 795, the oxide collar 795 is formed in a self-aligned manner to the buried plate 790. In other words, the lower edge 797 of the oxide collar 795 is self-aligned to the buried plate 790, such that the lower edge 797 of the oxide collar 795 is disposed at the same or essentially the same depth from the major surface 720 of the substrate as the upper edge 799 of the buried plate 790.

Figure 8:
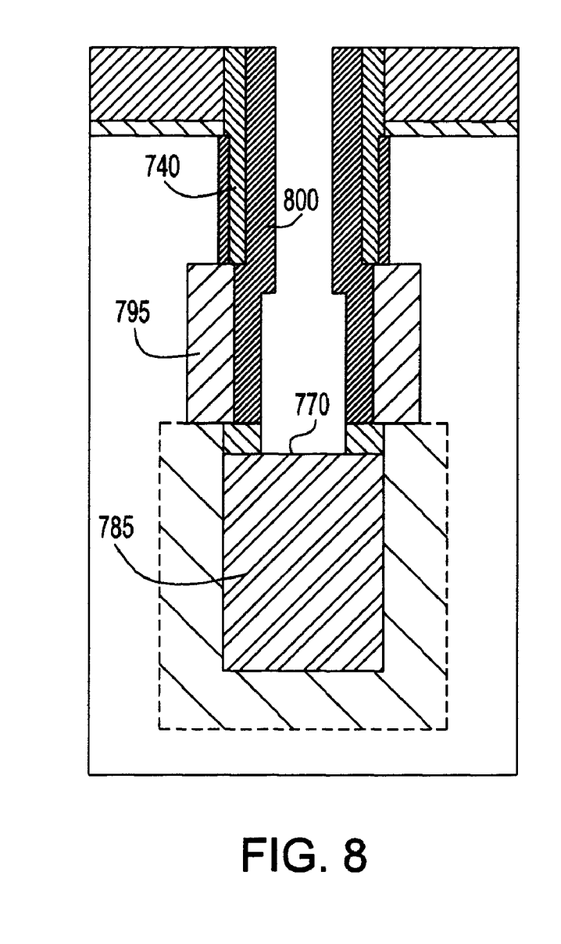

The formation of the buried plate 790 and oxide collar 795 are now complete. Further processing is now begun which will result in removal of the remaining ASG layer 785 and formation of a trench capacitor and other structures in the trench 600. As shown in FIG. 8, a second barrier layer 800 is formed overlying the previously formed oxide collar 795 and barrier layer 740. The second barrier layer 800 is formed by depositing a nitride such as silicon nitride or other material which facilitates good etch selectivity when etching oxide, and thereafter etching the deposited barrier layer material in the vertical direction, as by RIE, to expose the top surface of the remaining ASG layer 785, as indicated at the second depth 770.

Figure 9:
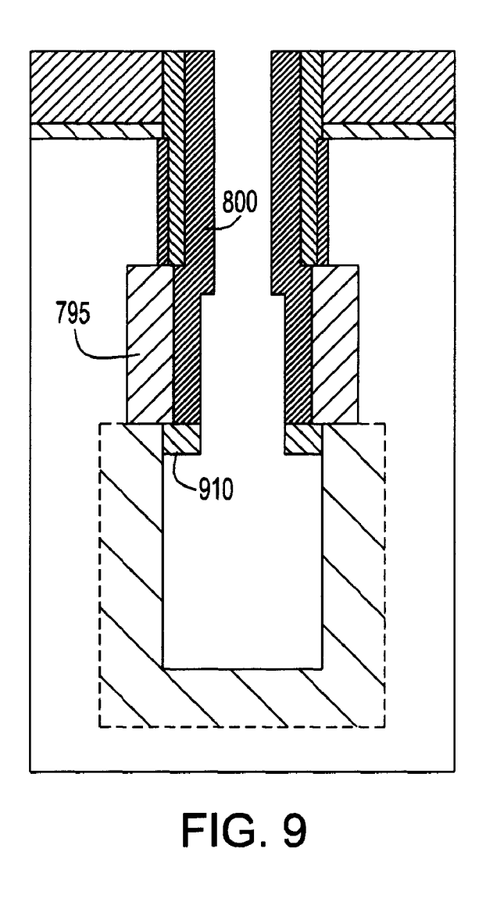
Figure 10:
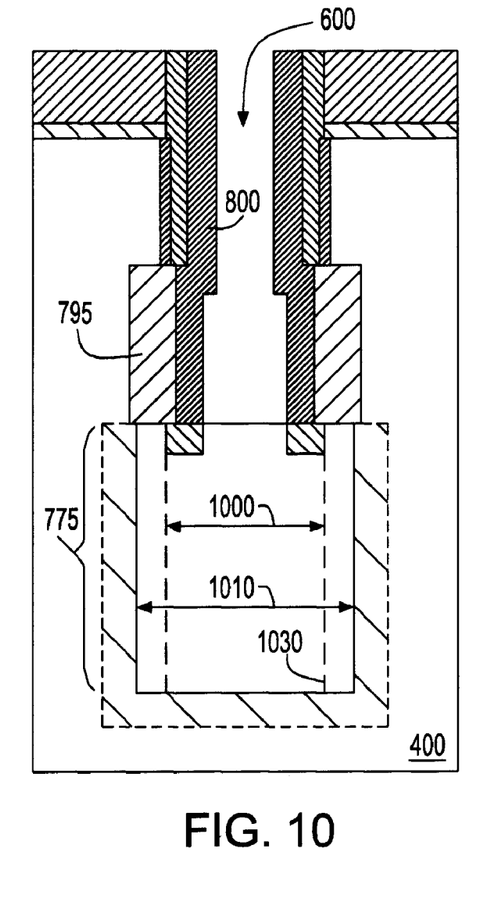

Thereafter, as shown in FIG. 9, the remaining ASG layer is removed by etching selective to the material of the second barrier layer 800. During this etch, the oxide collar 795 is protected by the second barrier layer 800 and the portion 910 of the cap layer that remains. FIG. 10 illustrates results of optional processing performed thereafter to widen the dimensions of the bottom portion 775 of the trench to form a bottle-shaped trench. The capacitance of a trench capacitor to be formed thereafter along the bottom portion of the trench (see FIG. 12 and accompanying description) is enhanced when the bottom portion is widened. Such processing is preferably performed by etching the semiconductor substrate 400 selective to the materials of the second barrier layer 800 and oxide collar 795 to produce a widened bottom portion 775 of the trench 600 having a widened dimension 1010 which is larger than the original dimension 1000 of the trench 600, as measured between the locations 1030 of the original sidewalls of the trench 600. Other trench capacitance enhancement approaches also may be practiced at this point in the process, such as formation of hemispherical silicon grain (HSG) in the bottom potion. The doping concentration in the buried plate can also be further raised at this time to increase the trench capacitance by performing gas phase doping (GPD), liquid phase doping (LPD), plasma doping, plasma immersion ion implantation (PIII), or any combination of these approaches.

Figure 11:
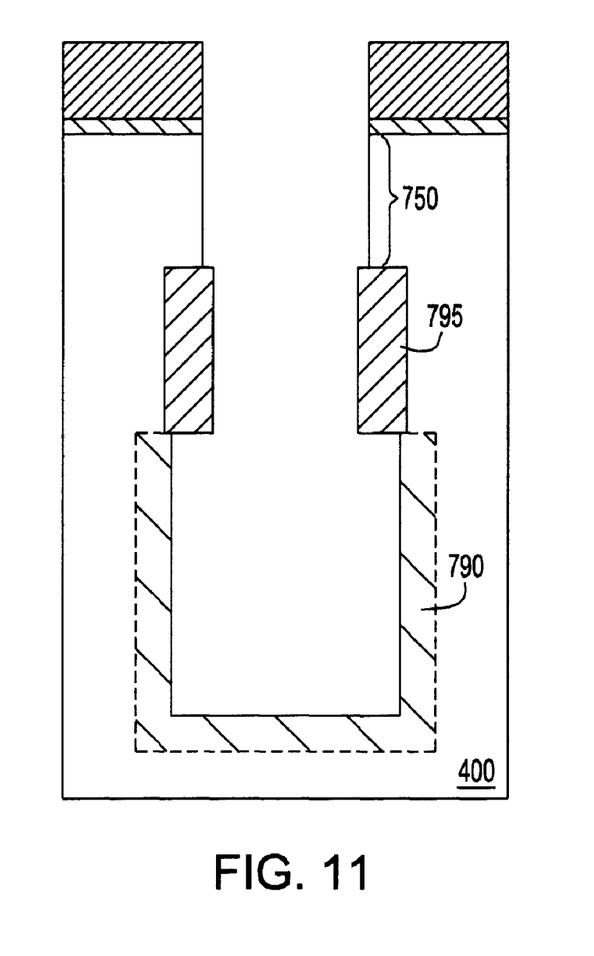

FIG. 11 illustrates the results of further processing to remove the barrier layer and second barrier layer from the trench, as well as the remaining portion of the cap layer. As a result, the buried plate 790 and the self-aligned collar 795 remain, and the top portion 750 of the trench sidewall is cleared of the barrier layers and oxide liner. Such processing is preferably performed by isotropic etching selective to the material of the semiconductor substrate 400 and to oxide.

Figure 12:
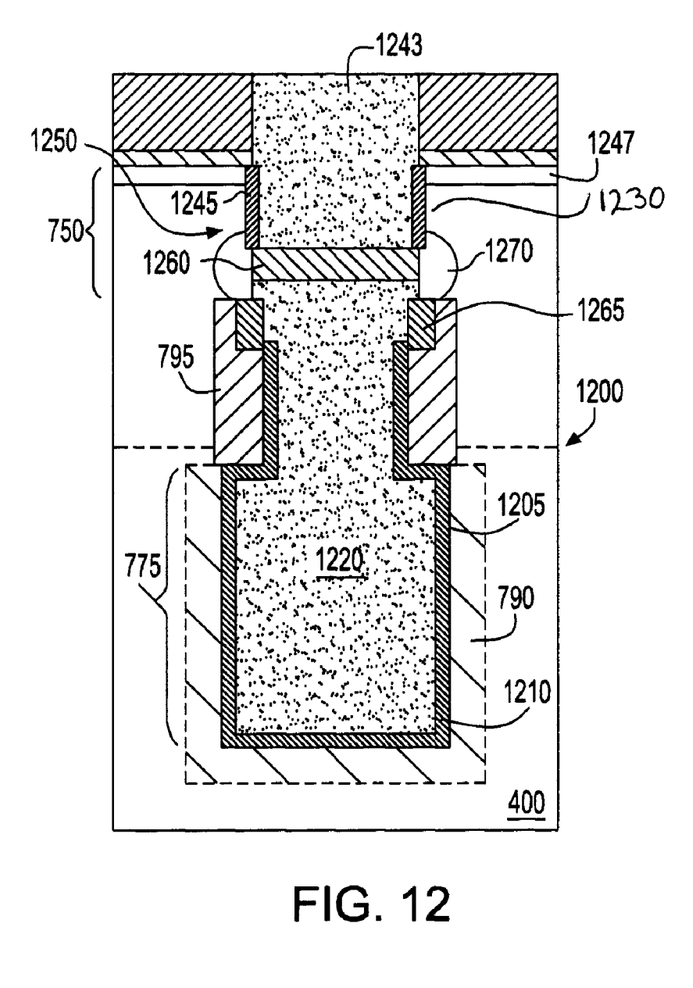

FIG. 12 illustrates a stage of processing after further steps have been performed to complete a trench capacitor 1200 and a vertical transistor 1250 disposed above the trench capacitor 1200. As shown in FIG. 12, the trench capacitor 1200 includes the buried plate 790, a node dielectric 1210 formed on the sidewall 1205 of the silicon where the buried plate 790 is located, and a node electrode 1220 disposed on the opposite side of the node dielectric 1210 from the buried plate 790.

The formation of the vertical transistor 1250 along the top portion 750 of the trench sidewall is only illustrative. Many other structures and ways of forming transistors which connect to the trench capacitor are possible. In the example shown in FIG. 12, the trench capacitor 1200 is separated from the vertical transistor by the oxide collar 795. The vertical transistor includes a gate conductor 1243, a gate dielectric 1245 and a channel region 1230. The channel region 1230 allows current to pass only when the gate conductor 1243 is biased at an appropriate voltage. The gate conductor 1243 is isolated from the node electrode 1220 by a trench top oxide 1260. The vertical transistor 1250 is electrically connected to the node electrode 1220 by an n-type buried strap outdiffusion 1270 formed in the silicon substrate 400 adjacent to the gate dielectric 1245, by outdiffusion of a dopant from a deposited buried strap 1265. A drain region 1247 is disposed in the silicon substrate 400 above the channel region 1230.

Alternatively, instead of a vertical transistor, a planar transistor can be formed which connects to the trench capacitor 1200. Alternatively, the trench capacitor 1200 can be simply connected to circuitry of the chip, such as for use in providing a source of local capacitance, e.g., for decoupling purposes.

Figure 13:
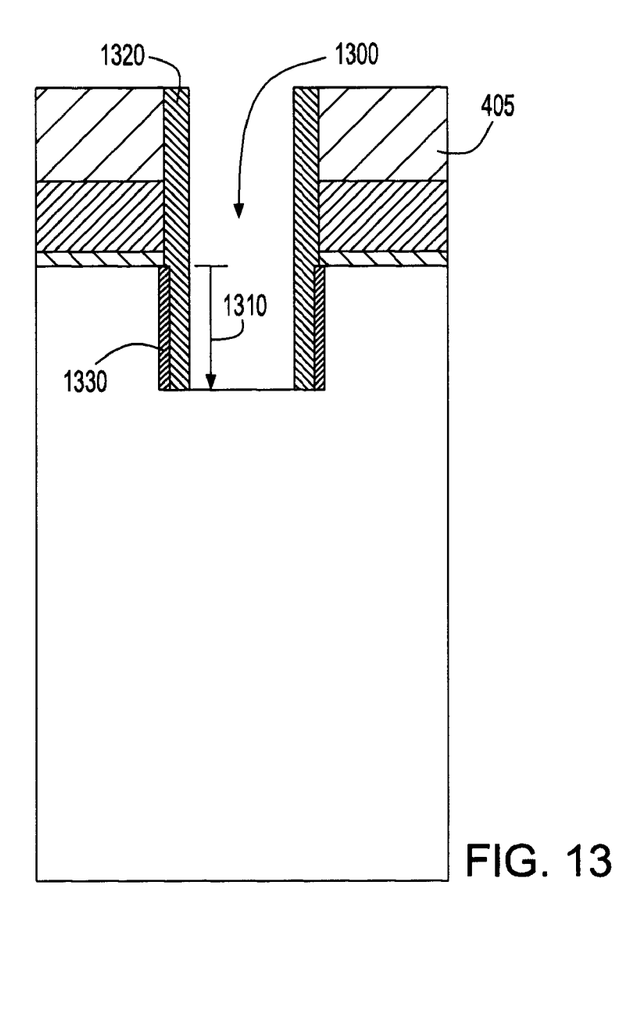
FIGS. 13 through 15 are cross-sectional views illustrating stages of processing according to a second embodiment of the invention.

FIGS. 13 through 15 illustrate processing according to a second embodiment of the invention, in which the deep trench is etched in two separate steps, such that the ASG layer need only be recessed once. In this embodiment, processing is the same as that shown and described above with reference to FIGS. 1 through 12, except for differences as noted herein. FIG. 13 illustrates a stage of processing following that shown in FIG. 2, in which a trench 1300 is etched only to a first depth 1310 which is less than the full depth of the trench when completed. A barrier layer 1320 is then formed on the sidewall of the trench, such barrier layer preferably consisting essentially of a nitride such as silicon nitride or other material which facilitates good etch selectivity when etching oxide. Such barrier layer 1320 is preferably formed over an oxide liner 1330 formed prior thereto on the trench sidewall. The barrier layer 1320 and oxide liner 1330 are preferably formed according to the process described above with reference to FIG. 5. These steps are performed in a manner allowing the hardmask layer 405 to remain in place.

Figure 14:
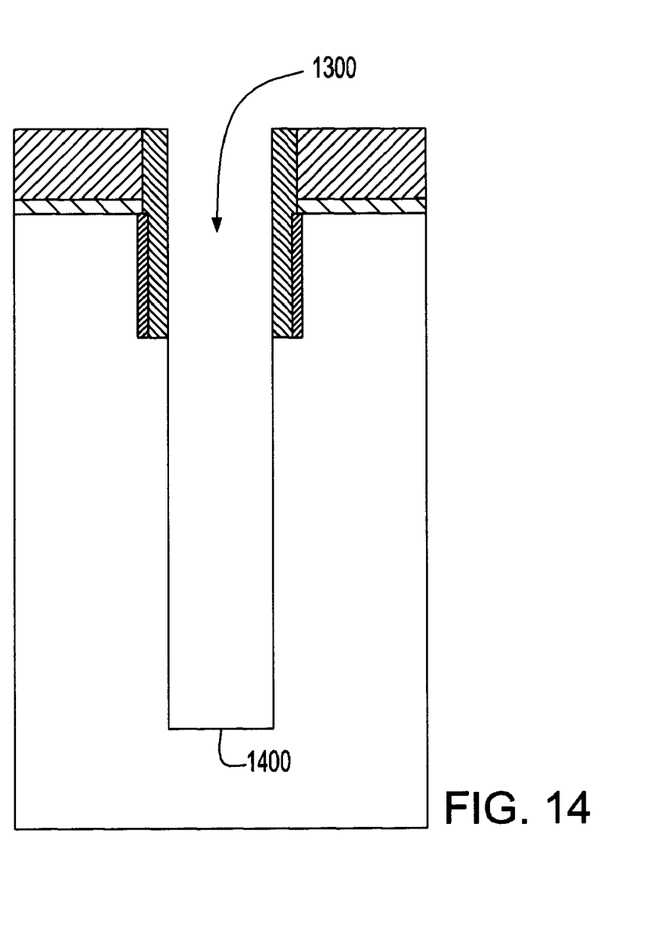
Figure 15:
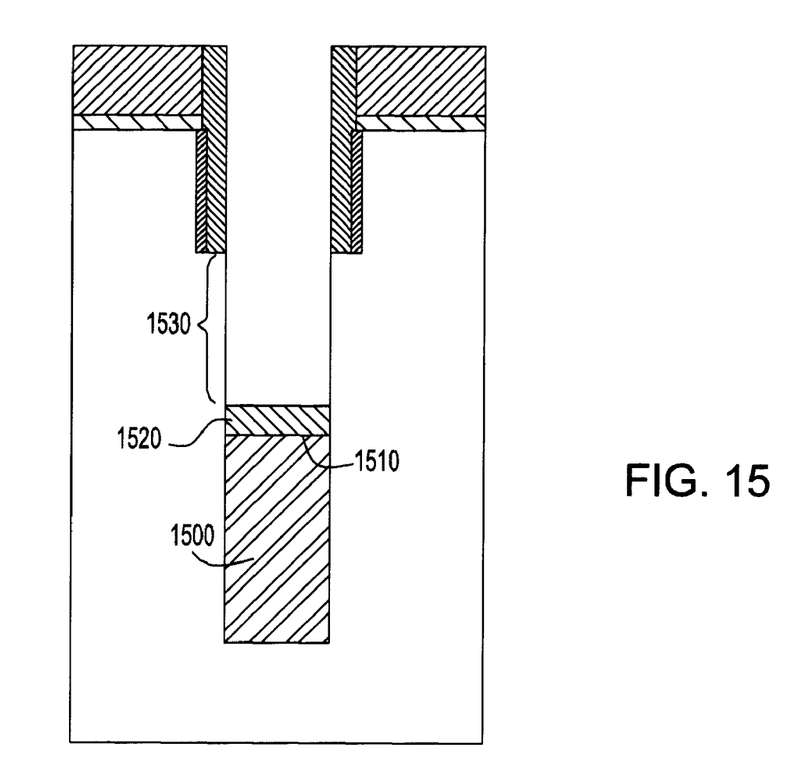

Thereafter, as shown in FIG. 14, the trench 1300 is etched to the full depth 1400, after which the hardmask is stripped from the structure. FIG. 15 illustrates a subsequent stage in which a dopant source layer 1500 consisting essentially of a material such as ASG is deposited and then recessed within the trench 1300 to a depth 1510. Alternatively, the layer 1500 may include a dopant source layer adjacent to the semiconductor substrate 400 and a layer of another material, which is preferably undoped, to fill the trench. The dopant source layer is preferably an ASG layer and the undoped material is preferably undoped oxide. In such case, hereinafter, the layer 1500 is referred to as the "ASG layer 1500" for simplicity.

Thereafter, a cap layer 1520 is formed to cover the ASG layer 1500, the cap layer 1500 preferably consisting essentially of a nitride such as silicon nitride or other material to facilitate good etch selectivity relative to oxide. Etching is performed selective to the material of the semiconductor substrate 400 such that the middle portion 1530 of the trench sidewall is cleared of the material of the cap layer 1520. Thereafter, processing proceeds in the same manner as that shown and described above with reference to FIGS. 7 through 12 to form a trench capacitor, and optionally, a transistor having a connection to the trench capacitor.

Accordingly, the foregoing described embodiments of the invention address challenges of the prior art through processing in which the collar is formed simultaneously with the buried plate, in a self-aligned manner to the buried plate.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of making a collar for a trench in a semiconductor substrate, the collar being a self-aligned to a buried plate disposed adjacent to the trench, comprising:
   forming a trench in a semiconductor substrate;
   depositing a dopant source layer in the trench;
   recessing the dopant source layer to a first depth below a major surface of the semiconductor substrate;
   forming a barrier layer along a portion of the sidewall of the trench above the first depth;
   further recessing the dopant source layer to a second depth below the first depth to expose a middle portion of the sidewall of the trench such that the dopant source layer remains below the second depth; and
   annealing in an oxygen-containing environment to simultaneously form an oxide collar along the middle portion of the sidewall of the trench while forming a buried plate in the semiconductor substrate adjacent to the dopant source layer.

2. A method as claimed in claim 1, wherein a cap layer is formed in the trench above the dopant source layer to prevent a dopant from the dopant source layer from diffusing into the semiconductor substrate adjacent to the middle portion.

3. A method as claimed in claim 1, wherein the barrier layer consists essentially of nitride.

4. A method as claimed in claim 3, wherein the nitride includes silicon nitride.

5. A method as claimed in claim 4, wherein an oxide liner is formed on the top portion of the trench sidewall prior to forming the barrier layer.

6. A method as claimed in claim 5, wherein the oxide collar is formed by local oxidation of the semiconductor substrate adjacent to the middle portion of the trench sidewall, wherein the barrier layer protects the top portion of the trench sidewall during the local oxidation process.

7. A method as claimed in claim 6, wherein the annealing is conducted at a temperature of above about 900° C.

8. A method as claimed in claim 7, wherein the annealing is conducted at a temperature of about 1050° C.

9. A method as claimed in claim 1, wherein the barrier layer is a first barrier layer, and the method further comprises forming a second barrier layer overlying the first barrier layer and the oxide collar, and thereafter removing the dopant source layer by etching selective to the material of the second barrier layer.

10. A method as claimed in claim 9, further comprising widening a lower portion of the trench below the second barrier layer by etching the buried plate region selective to the material of the second barrier layer.

11. A method as claimed in claim 9, further comprising removing the first and second barrier layers and thereafter forming a trench capacitor including the buried plate.

12. A method as claimed in claim 11, further comprising forming a transistor in the semiconductor substrate, the transistor having an element connecting to the trench capacitor.

13. A method of making a collar for a trench in a semiconductor substrate, the collar being self-aligned to a buried plate disposed adjacent to the trench, comprising:
   etching a trench to a first depth below a major surface of a semiconductor substrate;
   forming a barrier layer along a top portion of the sidewall of the trench above the first depth;
   etching the trench to a bottom depth below the first depth;
   depositing a dopant source layer in the trench;
   recessing a top surface of the dopant source layer to a second depth below the first depth to expose a middle portion of the sidewall of the trench between the first and second depths, the dopant source layer remaining in the trench below the second depth; and
   annealing in an oxygen-containing environment to simultaneously form an oxide collar by local oxidation of the semiconductor substrate along the middle portion of the sidewall of the trench while forming a buried plate in the semiconductor substrate adjacent to the dopant source layer.

14. A method as claimed in claim 13, wherein the barrier layer consists essentially of silicon nitride, the method further comprising forming an oxide liner on the sidewall of the trench prior to forming the barrier layer.

15. A method as claimed in claim 14, wherein the oxide collar is formed by a process of local oxidation of the semiconductor substrate adjacent to the middle portion of the trench sidewall, wherein the barrier layer protects the top portion of the trench sidewall during the local oxidation process.

* * * * *